United States Patent
Li et al.

(10) Patent No.: US 11,454,663 B2
(45) Date of Patent: Sep. 27, 2022

(54) SIGNAL PROCESSING METHOD

(71) Applicant: REALTEK SEMICONDUCTOR CORP., Hsinchu (TW)

(72) Inventors: Chia-Min Li, Hsinchu (TW); Liang-Wei Huang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/363,432

(22) Filed: Jun. 30, 2021

(65) Prior Publication Data

US 2022/0003804 A1    Jan. 6, 2022

(30) Foreign Application Priority Data

Jul. 1, 2020  (TW) ................................ 109122176

(51) Int. Cl.
| | | |
|---|---|---|
| G01R 31/02 | (2006.01) | |
| G01R 31/00 | (2006.01) | |
| G01R 31/319 | (2006.01) | |
| G01R 31/28 | (2006.01) | |
| G01R 31/52 | (2020.01) | |
| H01L 21/66 | (2006.01) | |

(52) U.S. Cl.
CPC ....... *G01R 31/002* (2013.01); *G01R 31/2805* (2013.01); *G01R 31/2884* (2013.01); *G01R 31/31908* (2013.01); *G01R 31/52* (2020.01); *H01L 22/34* (2013.01); *H01L 2924/00* (2013.01); *H01L 2924/0002* (2013.01)

(58) Field of Classification Search
CPC ............ G01R 31/002; G01R 31/31908; G01R 31/2805; G01R 31/2884; G01R 31/52; H04L 1/24; H01L 2924/00; H01L 2924/0002; H01L 22/34
USPC .......... 324/71, 378, 403, 415, 425, 500, 537
See application file for complete search history.

(56) References Cited

U.S. PATENT DOCUMENTS

| | | | |
|---|---|---|---|
| 2004/0030968 A1* | 2/2004 | Fan | H04L 1/243 714/704 |
| 2007/0168770 A1* | 7/2007 | Fan | H04L 1/243 714/704 |
| 2010/0322078 A1* | 12/2010 | Wang | H04L 12/12 370/241 |

(Continued)

OTHER PUBLICATIONS

IEEE Standard for Ethernet Section Three, 2012.

*Primary Examiner* — Raul J Rios Russo
(74) *Attorney, Agent, or Firm* — Li & Cai Intellectual Property (USA) Office

(57) ABSTRACT

A signal processing method is provided. The signal processing method is used in a Gigabit Ethernet system including a device under test (DUT) and a link partner (LP), and includes the following steps. Firstly, an interference detector is configured to detect whether the Gigabit Ethernet system is interfered by other signal sources. Next, a physical layer (PHY) of the DUT or a PHY of the LP is used to, in response to the Gigabit Ethernet system being interfered by the other signal sources, set a request signal indicating whether or not the physical layer enters a low power idle (LPI) mode as FALSE. Which PHY of the DUT and the LP is used to set the request signal indicating whether or not the PHY enters the LPI mode as FALSE depends upon which one of the DUT and the LP is provided with the interference detector.

12 Claims, 9 Drawing Sheets

(56) References Cited

U.S. PATENT DOCUMENTS

2011/0007664 A1   1/2011   Diab et al.

* cited by examiner

SIGNAL PROCESSING METHOD

CROSS-REFERENCE TO RELATED PATENT APPLICATION

This application claims the benefit of priority to Taiwan Patent Application No. 109122176, filed on Jul. 1, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a signal processing method, and more particularly to a signal processing method that can prevent a Gigabit Ethernet system from entering and exiting a low power idle (LPI) mode under interference from other signal sources and resulting in connection failure.

BACKGROUND OF THE DISCLOSURE

In order to reduce power loss of integrated circuits and achieve energy-saving purposes, IEEE 802.3 standards have formulated a low power idle (LPI) mode. In the LPI mode, a device under test (DUT) and a link partner (LP) of a Gigabit Ethernet system will stop transmitting data and stop operations of most circuit components, thereby achieving power saving effects. For example, references are made to FIGS. 1A and 1B. FIGS. 1A and 1B are control state diagrams of a physical layer (PHY) defined by the IEEE 802.3 standards. As shown in FIG. 1A, after entering SEND IDLE OR DATA state, in order for the PHY of the DUT or the PHY of the LP to enter the LPI mode, the following five conditions must be met:

minwait_timer_done;
loc_rcvr_status=OK;
rem_rcvr_status=OK;
loc_lpi_req=TRUE; and
rem_lpi_req=TRUE.

It should be noted that loc_lpi_req is a request signal indicating whether or not a PHY of a local end enters the LPI mode, and rem_lpi_req is a request signal indicating whether or not a PHY of a remote end enters the LPI mode. In other words, the PHY of the local end can set loc_lpi_req as TRUE or FALSE according to whether the PHY of the local end enters the LPI mode, and the PHY of the local end will receive loc_lpi_req from the PHY of the remote end as rem_lpi_req. It can be seen that the LPI mode of the Gigabit Ethernet system is bidirectional and symmetrical. Therefore, if one of the PHY of the DUT and the PHY of the LP does not send the request signal for entering the LPI mode, the PHY of the DUT and the PHY of the LP must continue to be in the SEND IDLE OR DATA state to send data or idle signals.

In addition, in the LPI mode, since the operations of most of the circuit components have stopped, resistance of the Gigabit Ethernet system to environmental changes will be greatly reduced, especially if there is interference from other signal sources in the environment. Once the Gigabit Ethernet system exits the LPI mode, the Gigabit Ethernet system must properly adjust the state within a specified time, or filters thereof must be properly converged in a very short time. Otherwise, the Gigabit Ethernet system will risk losing packets, or even more seriously, connection failure (Link Down). Therefore, providing a method to prevent the Gigabit Ethernet system from entering and exiting the LPI mode under interference of other signal sources, which may result in connection failures, has become an important issue in the related art.

SUMMARY OF THE DISCLOSURE

In response to the above-referenced technical inadequacies, the present disclosure provides a signal processing method, which is used in a Gigabit Ethernet system including a device under test (DUT) and a link partner (LP). The signal processing method includes the following steps. Firstly, an interference detector is configured to detect whether the Gigabit Ethernet system is interfered by other signal sources. Next, a physical layer of the DUT or a physical layer of the LP is used to, in response to the interference detector determining that the Gigabit Ethernet system is interfered by the other signal sources, set a request signal indicating whether or not the PHY enters a low power idle (LPI) mode as FALSE. Further, which one of the physical layer of the DUT and the physical layer of the LP is used to set the request signal indicating whether or not the physical layer enters the LPI mode as FALSE depends upon which one of the DUT and the LP the interference detector is provided on.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1A:
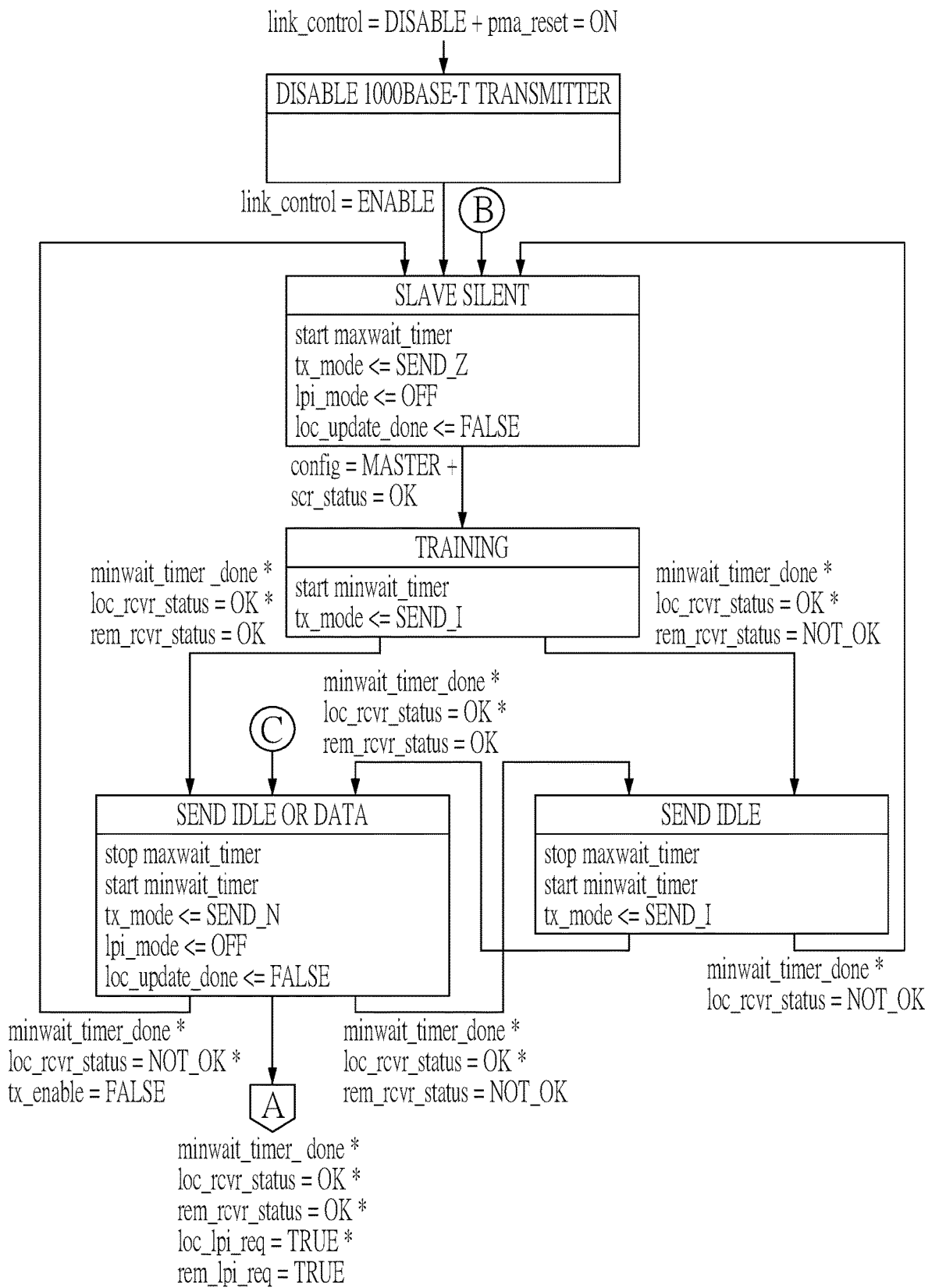
FIGS. 1A and 1B are control state diagrams of a physical layer (PHY) defined by IEEE 802.3 standards.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
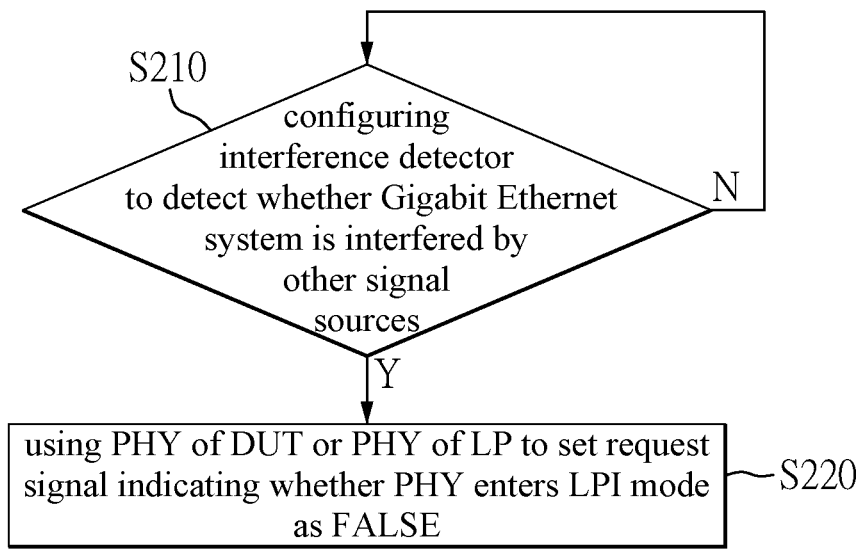
FIG. 2 is a flow chart of a signal processing method provided by an embodiment of the present disclosure.

Reference is made to FIG. 2, which is a flow chart of a signal processing method provided by an embodiment of the present disclosure. It should be noted that the signal processing method of FIG. 2 can be used in a Gigabit Ethernet system including a device under test (DUT) and a link partner (LP). However, the present disclosure does not limit the specific implementation of the DUT and the LP, and those skilled in the art can design based on actual needs or applications. As shown in FIG. 2, in step S210, the present embodiment uses an interference detector to detect whether the Gigabit Ethernet system is interfered by other signal sources. If the interference detector detects that the Gigabit Ethernet system is interfered by other signal sources, the method in the present embodiment proceeds to step S220; if the interference detector does not detect that the Gigabit Ethernet system is interfered by other signal sources, the method in the present embodiment returns to step S210. In other words, once the interference detector detects that the Gigabit Ethernet system is interfered by the other signal sources, the method in the present embodiment executes step S220.

In step S220, a physical layer of the DUT or a physical layer of the LP is used to set a request signal indicating whether or not the PHY enters a low power idle (LPI) mode as FALSE, that is, loc_lpi_req=FALSE, such that both the PHY of the DUT and the PHY of the LP exit from the LPI mode. It is worth mentioning that the above interference detector can be implemented in an analog circuit or a digital circuit. In short, the present disclosure does not limit the specific implementation of the interference detector. In addition, when the request signal indicating whether or not the PHY enters a low power idle (LPI) mode is set as FALSE, which one of the physical layer of the DUT and the physical layer of the LP requests to exit from the LPI mode depends upon which one of the DUT and the LP is provided with the interference detector. The PHY is an electronic circuit required to implement functions of a physical layer of an OSI model in a network interface controller, and the PHY is usually implemented as an integrated circuit.

In addition, when the PHY of the DUT and the PHY of the LP are both in a SEND IDLE OR DATA state, filters of the Gigabit Ethernet system can rely on the signal from another party to maintain synchronization and connection status, such that resistance to interference can be greatly improved. Therefore, once the interference detector detects that the Gigabit Ethernet system is not interfered by the other signal sources, an original setting for the PHY in the present embodiment can be restored, that is, an initiative for entering the LPI mode is returned to be determined according to whether there is any packet to be transmitted in an upper layer.

Figure 1B:
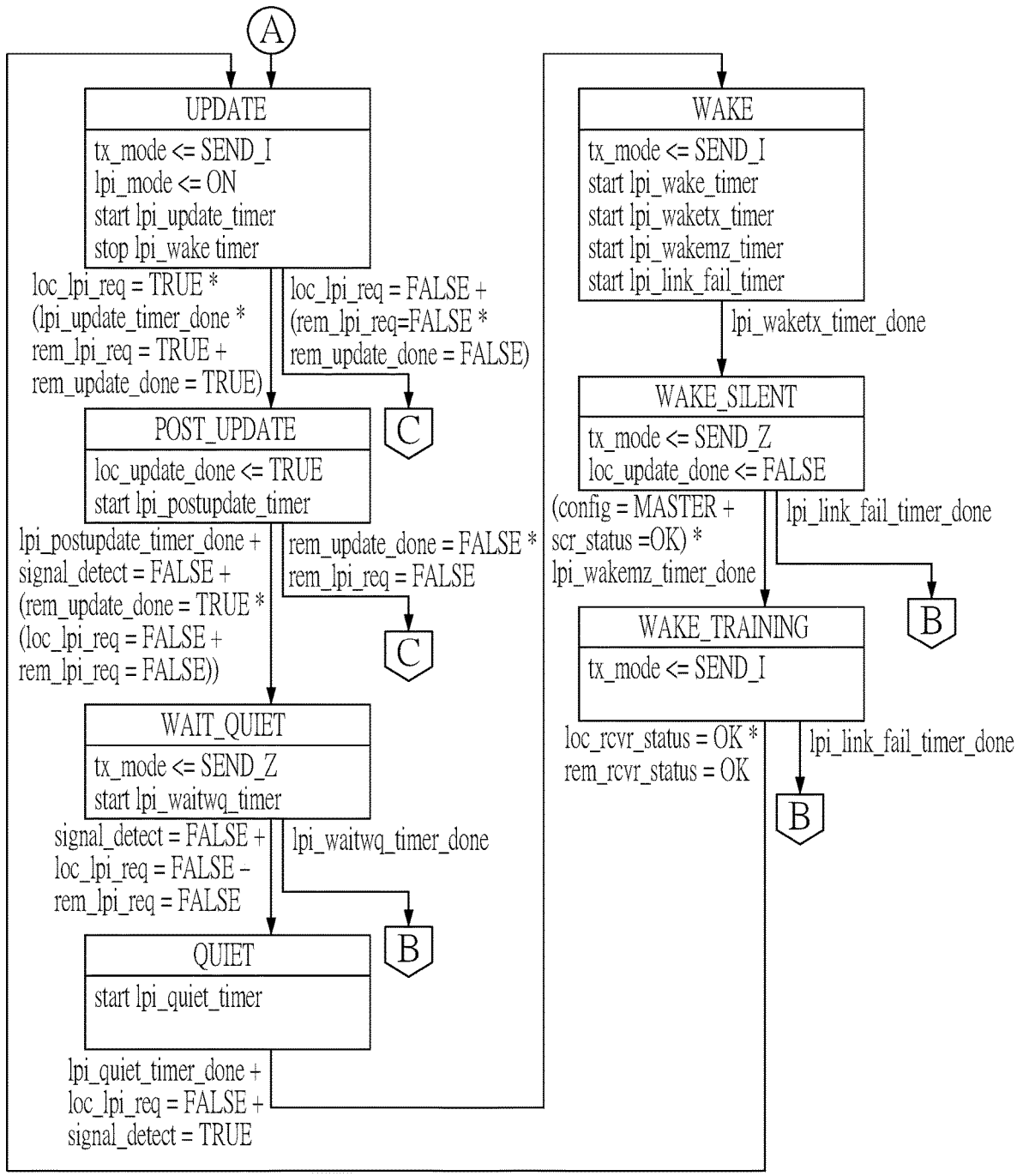

Furthermore, as shown in FIG. 1B, the LPI mode includes an UPDATE state, a POST_UPDATE state, a WAIT_QUIET state, a QUIET state, a WAKE state, and the like. Before entering the QUIET state of the LPI mode, if the PHY of the DUT or the PHY of the LP needs to exit from the LPI mode, only the following five situations will occur:

the PHY of the LP exits from the LPI mode in the UPDATE state;

the PHY of the LP exits from the LPI mode in the POST_UPDATE state;

the PHY of the LP exits from the LPI mode in the WAIT_QUIET state;

the PHY of the DUT exits from the LPI mode in the UPDATE state; and the PHY of the DUT exits from the LPI mode in the POST_UPDATE state.

Therefore, reference is now made to FIGS. 3 to 7. FIGS. 3 to 7 are schematic diagrams showing the signal processing method of FIG. 2 being used in the above five situations, such that both the PHY of the DUT and the PHY of the LP exit from the LPI mode.

Figure 3:
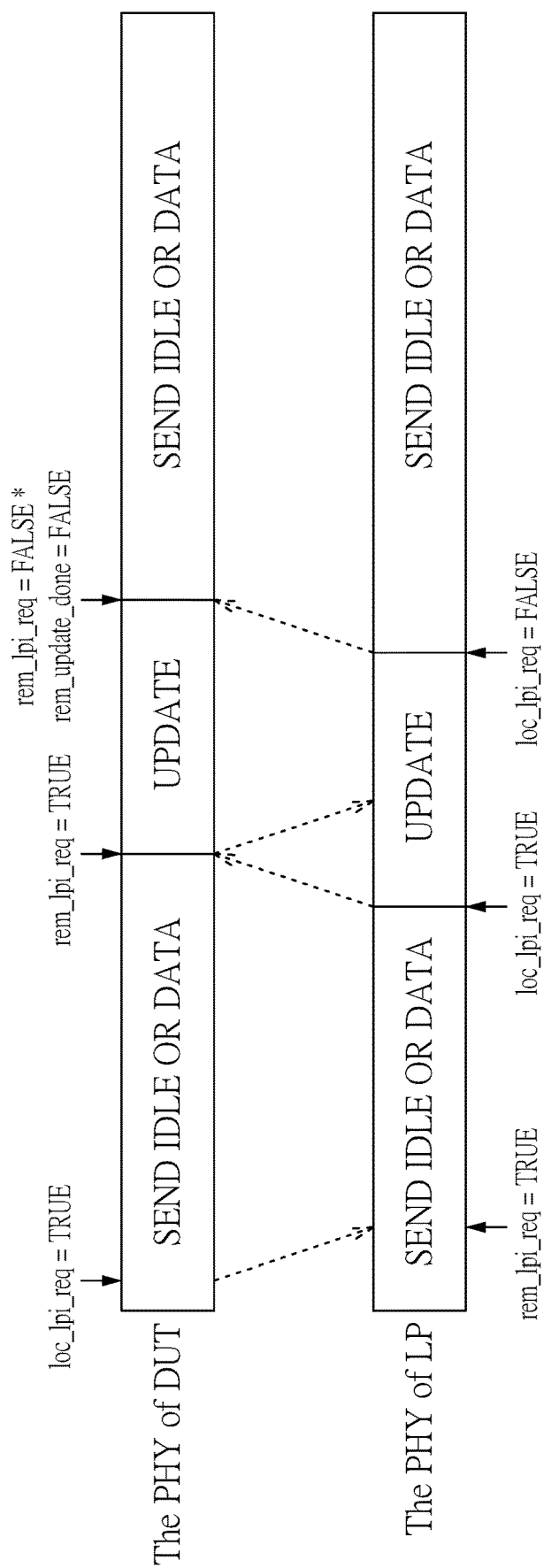
FIG. 3 is a schematic diagram showing the signal processing method of FIG. 2 used for a PHY of a link partner (LP) to exit from a low power idle (LPI) mode in an UPDATE state, such that both a PHY of a device under test (DUT) and the PHY of the LP exit from the LPI mode.

As shown in FIG. 3, when the LP is provided with the interference detector and the interference detector detects that the Gigabit Ethernet system is interfered by the other signal sources when the PHY of the LP is in the UPDATE state of the LPI mode, the PHY of the LP is used to set the request signal indicating whether or not the PHY enters the LPI mode as FALSE, and send the request signal that is set to FALSE to the PHY of the DUT, that is, loc_lpi_req=FALSE, and then the PHY of the LP jumps directly from the UPDATE state of the LPI mode to a SEND IDLE OR DATA state.

In contrast, when the PHY of the DUT receives the request signal that is set to FALSE by the PHY of the LP when the PHY of the DUT is in the UPDATE state of the LPI mode, the PHY of the DUT can satisfy rem_lpi_req=FALSE and rem_update_done=FALSE. Therefore, the PHY of the DUT jumps directly from the UPDATE state of the LPI mode to the SEND IDLE OR DATA state. In other words, both the PHY of the DUT and the PHY of the LP exit from the LPI mode.

Figure 4:
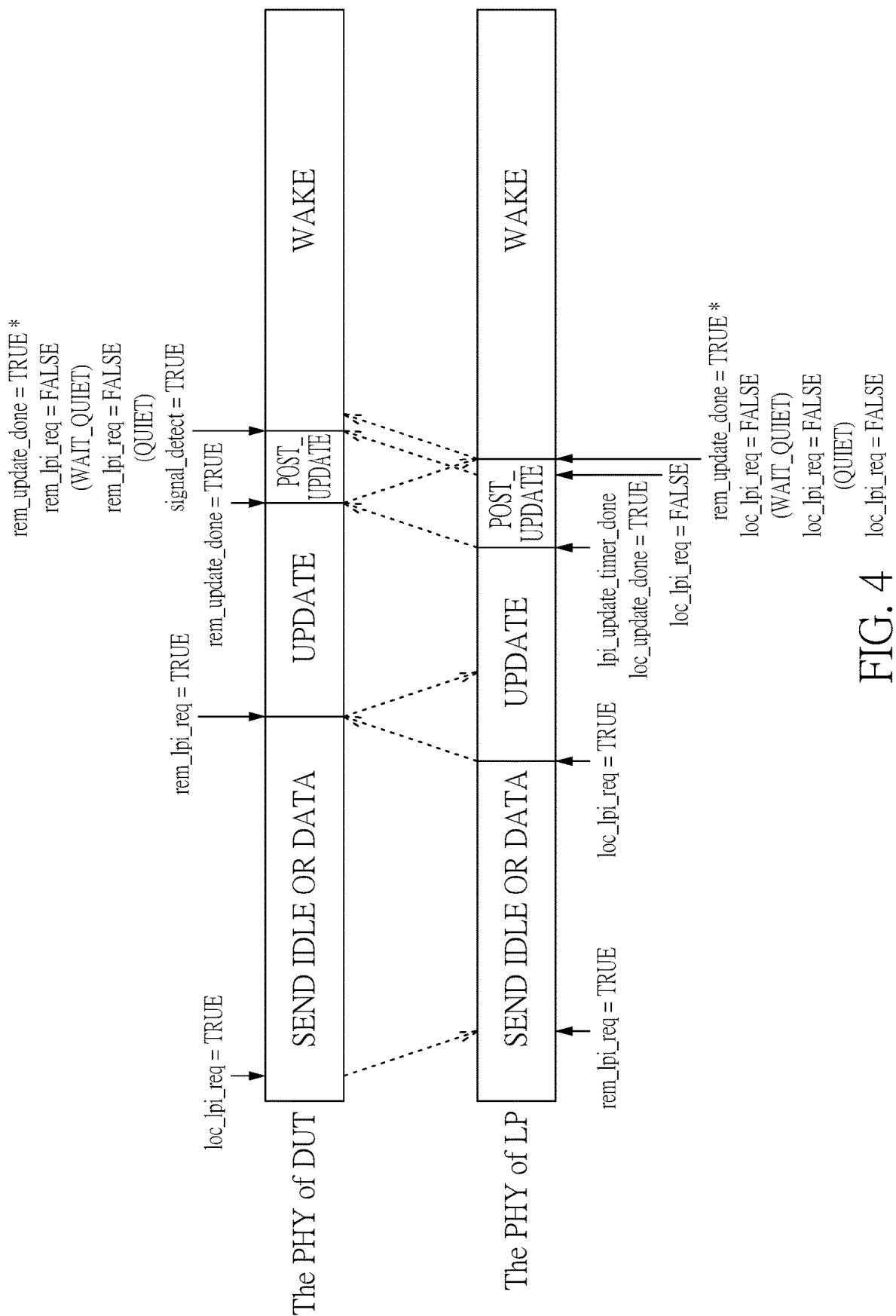
FIG. 4 is a schematic diagram showing the signal processing method of FIG. 2 used for the PHY of the LP to exit from the LPI mode in a POST_UPDATE state, such that both the PHY of the DUT and the PHY of the LP exit from the LPI mode.

Next, as shown in FIG. 4, when the LP is provided with the interference detector and the interference detector detects that the Gigabit Ethernet system is interfered by the other signal sources when the PHY of the LP is in a POST_UPDATE state of the LPI mode, the PHY of the LP is used to set the request signal indicating whether or not the PHY enters the LPI mode as FALSE, and send the request signal that is set to FALSE to the PHY of the DUT. Then, the PHY of the LP waits until the PHY of the DUT enters the POST_UPDATE state of the LPI mode, i.e., the PHY of the LP satisfying both rem_update_done=TRUE and loc_lpi_req=FALSE, before speeding up to enter the WAIT_QUIET state and the QUIET state of the LPI mode in sequence, and then entering the WAKE state of the LPI mode.

In contrast, when the PHY of the DUT receives the request signal from the PHY of the LP that is set to FALSE when the PHY of DUT is in the POST_UPDATE state of the LPI mode, the PHY of the DUT enters the WAIT_QUIET state and the QUIET state of the LPI mode in sequence until the PHY of the DUT receives a signal detection value set to TRUE again, that is, signal_detect=TRUE, and then the PHY of the DUT enters the WAKE state in the LPI mode.

Figure 5:
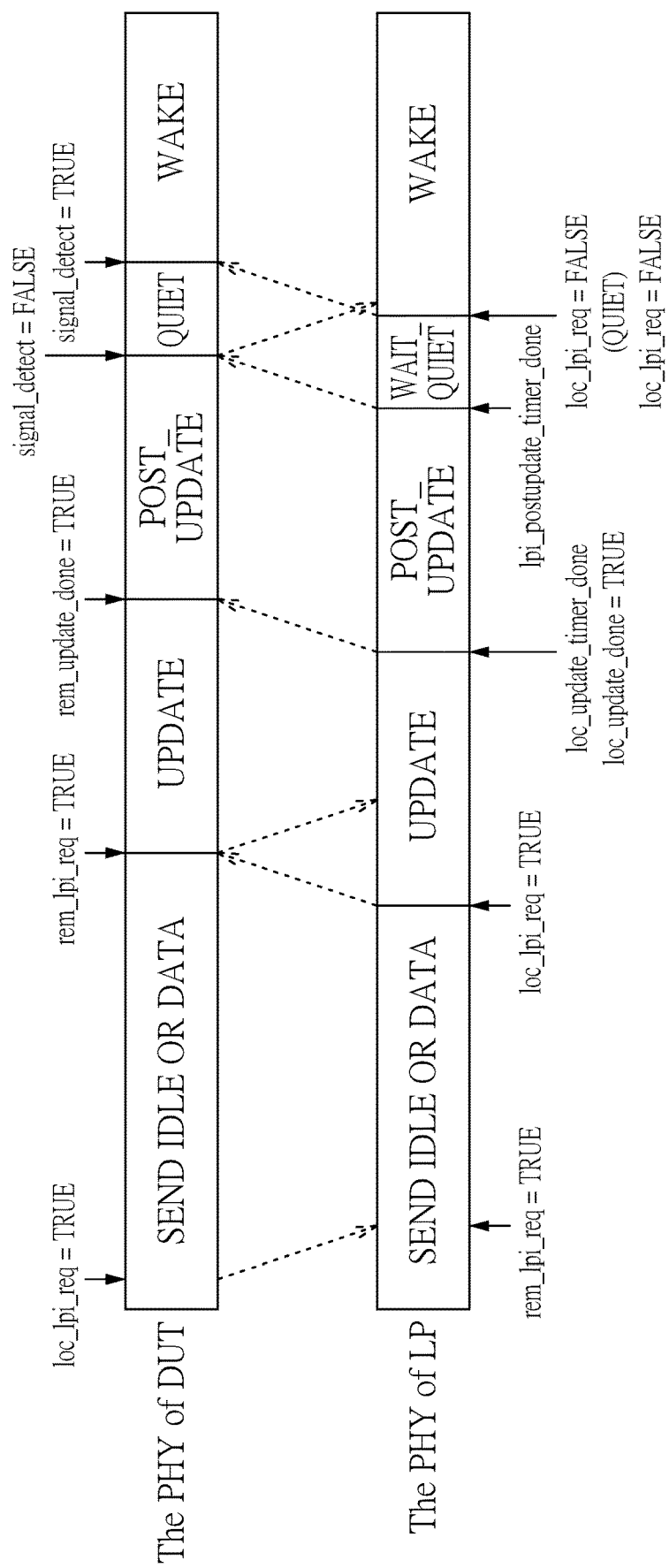
FIG. 5 is a schematic diagram showing the signal processing method of FIG. 2 used for the PHY of the LP to exit from the LPI mode in a WAIT_QUIET state, such that both the PHY of the DUT and the PHY of the LP exit from the LPI mode.

Next, as shown in FIG. 5, when the LP is provided with the interference detector and the interference detector detects that the Gigabit Ethernet system is interfered by the other signal sources when the PHY of the LP is in the WAIT_QUIET state of the LPI mode, the PHY of the LP is used to set the request signal indicating whether or not the PHY enters the LPI mode as FALSE, that is, loc_lpi_req=FALSE, and send the request signal that is set to FALSE to the PHY of the DUT. The PHY of the LP then speeds up to enter the QUIET state of the LPI mode, and then enters the WAKE state in LPI mode.

In contrast, when the PHY of the DUT receives the request signal set to FALSE by the PHY of the LP when the PHY of the DUT is in the QUIET state of the LPI mode, until the PHY of the DUT receive the signal detection value set to TRUE again, that is, signal_detect=TRUE, the PHY of DUT enters the WAKE state of LPI mode.

Figure 6:
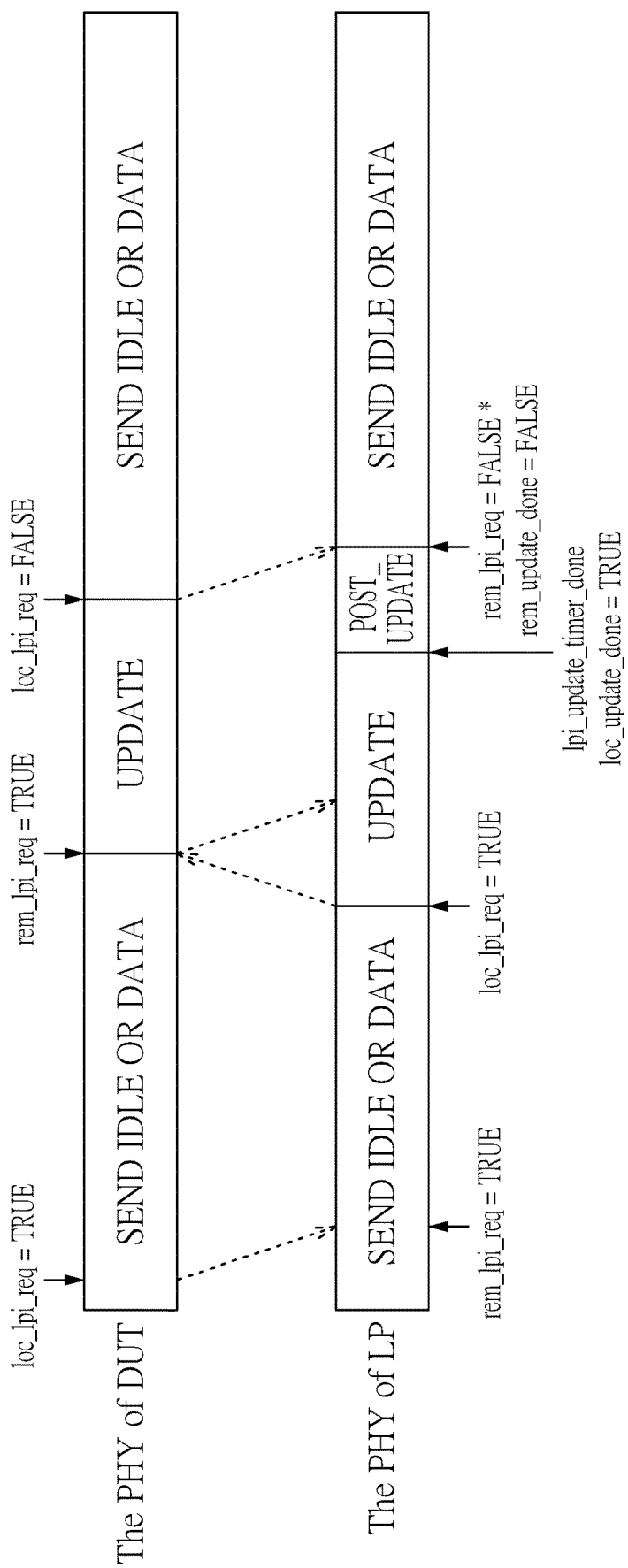
FIG. 6 is a schematic diagram showing the signal processing method of FIG. 2 used for the PHY of the DUT to exit from the LPI mode in the UPDATE state, such that both the PHY of the DUT and the PHY of the LP exit from the LPI mode.

In addition, as shown in FIG. 6, when the DUT is provided with the interference detector and the interference detector detects that the Gigabit Ethernet system is interfered by the other signal sources when the physical layer of the DUT is in the UPDATE state of the LPI mode, the PHY of the DUT is used to set the request signal indicating whether or not the PHY enters the LPI mode as FALSE, that is, loc_lpi_req=FALSE, and send the request signal that is set to FALSE to the PHY of the LP, and then the PHY of the DUT jumps directly from the UPDATE state of the LPI mode to the SEND IDLE OR DATA state of the LPI mode.

In contrast, when the PHY of the LP receives the request signal set to FALSE by the PHY of the DUT when the PHY of the LP is in the UPDATE state or the POST_UPDATE state of the LPI mode, the PHY of LP jumps directly from the UPDATE state of the LPI mode or the POST_UPDATE state of the LPI mode to the SEND IDLE OR DATA state. The details of FIG. 6 are as depicted in FIG. 3, and will not be repeated herein.

Figure 7:
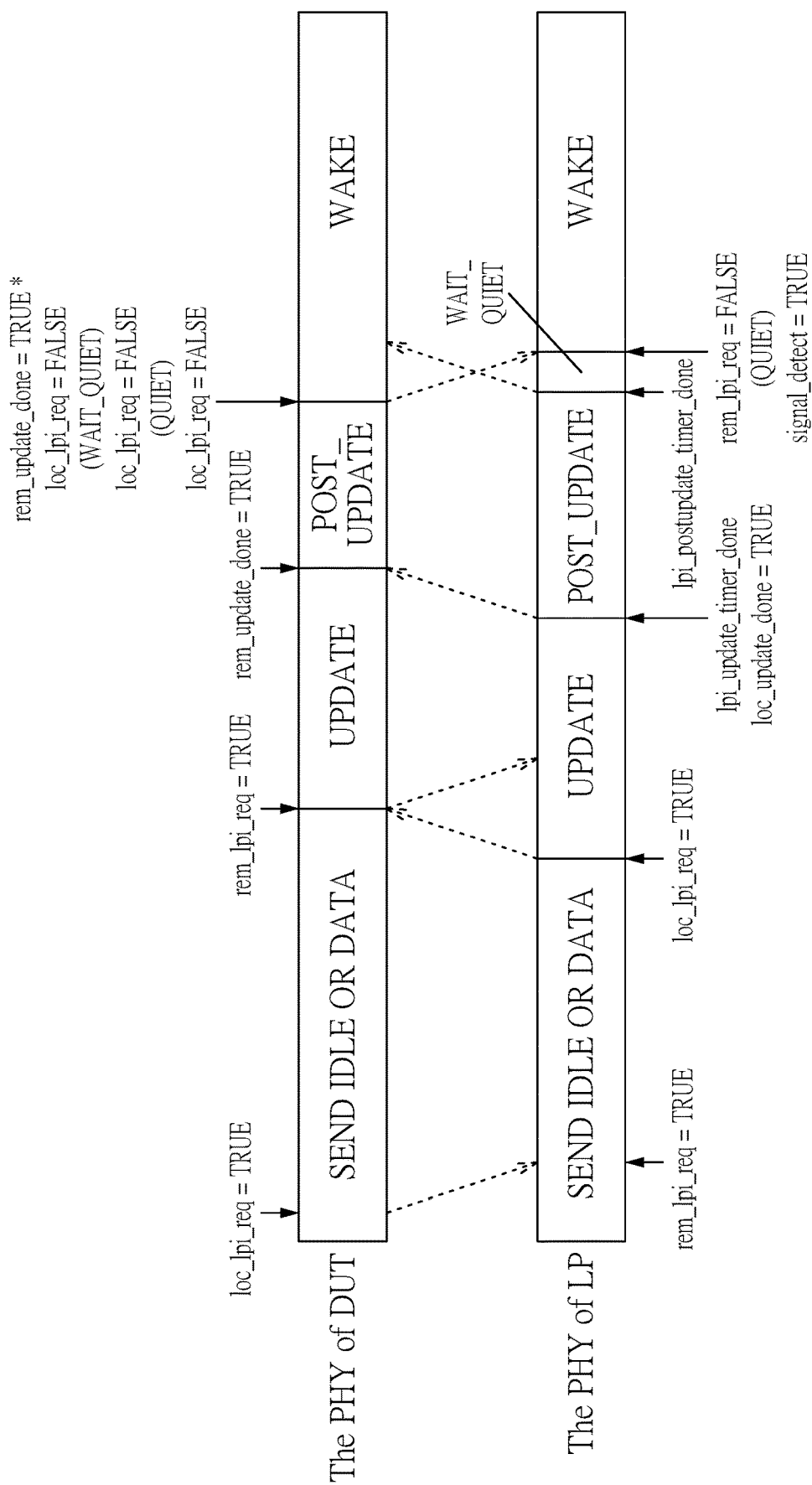
FIG. 7 is a schematic diagram showing the signal processing method of FIG. 2 used for the PHY of the DUT to exit from the LPI mode in the POST_UPDATE state, such that both the PHY of the DUT and the PHY of the LP exit from the LPI mode.

Finally, as shown in FIG. 7, when the DUT is provided with the interference detector and the interference detector detects that the Gigabit Ethernet system is interfered by the other signal sources when the PHY of the DUT is in the POST_UPDATE state of the LPI mode, the PHY of the DUT is used to set the request signal indicating whether or not the physical layer enters the LPI mode as FALSE, and send the request signal that is set to FALSE to the PHY of the LP, and then wait until the PHY of the LP enters the POST_UPDATE state of the LPI mode, i.e., the PHY of the DUT satisfying rem_update_done=TRUE and loc_lpi_req=FALSE, therefore, the PHY of the DUT speeds up to enter the WAIT_QUIET state and the QUIET state of the LPI mode in sequence, and then enters the WAKE state of the LPI mode. It is worth mentioning that in the embodiment of FIG. 7, since the PHY of the LP enters the POST_UPDATE state of the LPI mode earlier than the PHY of the DUT, therefore, when the PHY of the DUT sets loc_lpi_req to FALSE when the PHY of the DUT is in the POST_UPDATE state, the PHY of the DUT has already satisfied rem_update_done=TRUE.

In contrast, when the PHY of the LP receives the request signal that is set to FALSE by the PHY of the DUT when the PHY of the LP is in the POST_UPDATE state of the LPI mode or the WAIT_QUIET state of the LPI mode, the PHY of the LP speeds up to enter the QUIET state of the LPI mode, until the PHY of the LP receives the signal detection value set to TRUE again, that is, signal_detect=TRUE, and the PHY of the LP enters the WAKE state of the LPI mode. The details of FIG. 7 are as described in FIG. 4 and FIG. 5, and will not be repeated herein. In short, the present disclosure can modify a request state diagram of the local LPI defined by the IEEE 802.3 standards according to the signal processing method of FIG. 2.

Figure 8:
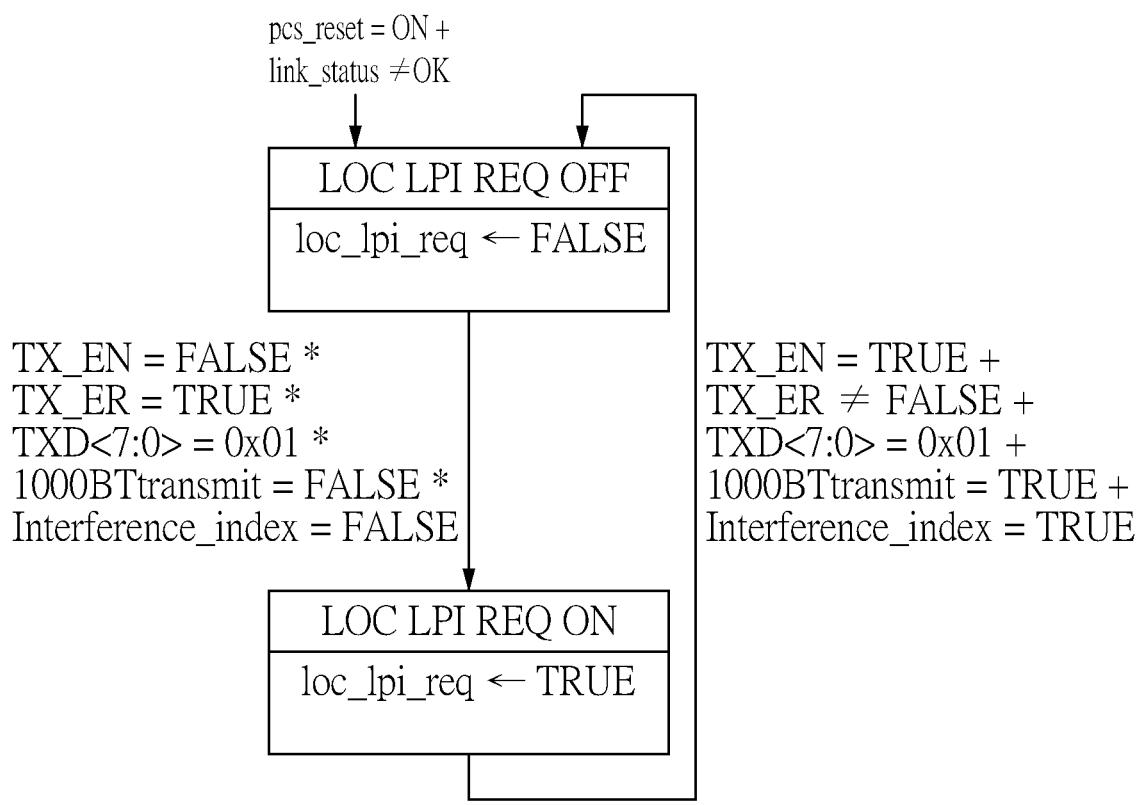
FIG. 8 is a Local LPI Request state diagram modified according to the signal processing method of FIG. 2.

As shown in FIG. 8, compared with the existing Gigabit Ethernet system, after entering a local end LPI request to turn off (LOC LPI REQ OFF) state, when the PHY of the DUT or the PHY of the LP needs to set loc_lpi_req as TRUE, an additional condition must be met: Interference_index=FALSE. In contrast, after entering a local end LPI request to turn on (LOC LPI REQ ON) state, when the PHY of the DUT or the PHY of the LP needs to set loc_lpi_req to FALSE, an additional condition must be met: Interference_index=TRUE. That is, Interference_index is a notification signal from the interference detector indicating whether or not it detects that the Gigabit Ethernet system is interfered by the other signal sources, and Interference_index=TRUE represents that the interference detector detects that the Gigabit Ethernet system currently suffers interference from other signal sources. Therefore, the PHY of the DUT or the PHY of the LP provided with the interference detector will set loc_lpi_req to FALSE, such that the PHY of the DUT and the PHY of the LP both exit from the LPI mode. Since other conditions of the local LPI request state diagram are already known to those skilled in the art, details associated with FIG. 8 will not be repeated.

In conclusion, in the signal processing method provided by the embodiments of the present disclosure, once the interference detector detects that the Gigabit Ethernet system is interfered by the other signal sources, the PHY of the DUT or the PHY of the LP that is provided with the interference detector sets loc_lpi_req as FALSE, such that the PHY of the DUT or the PHY of the LP exits from the LPI mode. That is to say, the present disclosure can prevent the Gigabit Ethernet system from connection failure due to interference from other signal sources in the LPI mode by merely modifying a control flow of loc_lpi_req, and the present disclosure can be implemented without adding an excessive amount of hardware.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A signal processing method used in a Gigabit Ethernet system including a device under test (DUT) and a link partner (LP), the signal processing method comprising:
    configuring an interference detector to detect whether the Gigabit Ethernet system is interfered by other signal sources; and
    using a physical layer (PHY) of the DUT or a physical layer of the LP to, in response to the interference detector determining that the Gigabit Ethernet system is interfered by the other signal sources, set a request signal indicating whether or not the physical layer enters a low power idle (LPI) mode as FALSE.

2. The signal processing method according to claim 1, wherein which one of the physical layer of the DUT and the physical layer of the LP is used to set the request signal indicating whether or not the physical layer enters the LPI mode as FALSE depends upon which one of the DUT and the LP the interference detector is provided on.

3. The signal processing method according to claim 1, wherein, when the interference detector is provided on the LP and the interference detector detects that the Gigabit Ethernet system is interfered by the other signal sources during a time when the physical layer of the LP is in an UPDATE state of the LPI mode, the physical layer of the LP is used to set the request signal indicating whether or not the physical layer enters the LPI mode as FALSE, and send the request signal that is set to FALSE to the physical layer of the DUT, and then the physical layer of the LP jumps directly from the UPDATE state of the LPI mode to a SEND IDLE OR DATA state.

4. The signal processing method according to claim 3, wherein, when the physical layer of the DUT receives the request signal set to FALSE from the physical layer of the LP during a time when the physical layer of the DUT is in the UPDATE state of the LPI mode, the physical layer of the DUT jumps directly from the UPDATE state of the LPI mode to the SEND IDLE OR DATA state.

5. The signal processing method according to claim 1, wherein, when the LP is provided with the interference detector and the interference detector detects that the Gigabit Ethernet system is interfered by the other signal sources during a time when the physical layer of the LP is in a POST_UPDATE state of the LPI mode, the physical layer of the LP is used to set the request signal indicating whether or not the physical layer enters the LPI mode as FALSE, and send the request signal that is set to FALSE to the physical layer of the DUT, and then the physical layer of the LP waits until the physical layer of the DUT enters the POST_UPDATE state of the LPI mode before speeding up to enter a WAIT_QUIET state and a QUIET state of the LPI mode in sequence, and then entering a WAKE state of the LPI mode.

6. The signal processing method according to claim 5, wherein, when the physical layer of the DUT receives the request signal set to FALSE from the physical layer of the LP during a time when the physical layer of the DUT is in the POST_UPDATE state of the LPI mode, the physical layer of the DUT enters the WAIT_QUIET state and the QUIET state of the LPI mode in sequence, and the physical layer of the DUT enters the WAKE state of the LPI mode only after receiving a signal detection value set to TRUE again.

7. The signal processing method according to claim 1, wherein, when the LP is provided with the interference detector and the interference detector detects that the Gigabit Ethernet system is interfered by the other signal sources during a time when the physical layer of the LP is in a WAIT_QUIET state of the LPI mode, the physical layer of the LP is used to set the request signal indicating whether or not the physical layer enters the LPI mode to FALSE, and send the request signal set to FALSE to the physical layer of the DUT, and then the physical layer of the LP speeds up to enter a QUIET state of the LPI mode, and then enters a WAKE state of the LPI mode.

8. The signal processing method according to claim 7, wherein, when the physical layer of the DUT receives the request signal set to FALSE from the physical layer of the LP during a time when the physical layer of the DUT is in the QUIET state of the LPI mode, the physical layer of the DUT enters the WAKE state of the LPI mode only after receiving a signal detection value set to TRUE again.

9. The signal processing method according to claim 1, wherein, when the DUT is provided with the interference detector and the interference detector detects that the Gigabit Ethernet system is interfered by the other signal sources during a time when the physical layer of the DUT is in an UPDATE state of the LPI mode, the physical layer of the DUT is used to set the request signal indicating whether or not the physical layer enters the LPI mode as FALSE, and send the request signal that is set to FALSE to the physical layer of the LP, and then the physical layer of the DUT jumps directly from the UPDATE state of the LPI mode to a SEND IDLE OR DATA state of the LPI mode.

10. The signal processing method according to claim 9, wherein, when the physical layer of the LP receives the request signal set to FALSE from the physical layer of the DUT during a time when the physical layer of the LP is in the UPDATE state or a POST_UPDATE state of the LPI mode, the physical layer of the LP jumps directly from the UPDATE state of the LPI mode to the SEND IDLE OR DATA state.

11. The signal processing method according to claim 1, wherein, when the DUT is provided with the interference detector and the interference detector detects that the Gigabit Ethernet system is interfered by the other signal sources during a time when the physical layer of the DUT is in a POST_UPDATE state of the LPI mode, the physical layer of the DUT is used to set the request signal indicating whether or not the physical layer enters the LPI mode as FALSE, and send the request signal that is set to FALSE to the physical layer of the LP, and then the physical layer of the DUT waits until the physical layer of the LP enters the POST_UPDATE state of the LPI mode before speeding up to enter a WAIT_QUIET state and a QUIET state of the LPI mode in sequence, and then entering a WAKE state of the LPI mode.

12. The signal processing method according to claim 11, wherein when the physical layer of the LP receives the request signal set to FALSE from the physical layer of the DUT when the physical layer of the LP is in the POST_UPDATE state or the WAIT_QUIET state of the LPI mode, the physical layer of the LP speeds up to enter the QUIET state of the LPI mode, and the physical layer of the LP enters the WAKE state of the LPI mode only after receiving a signal detection value set to TRUE again.

* * * * *